(12) United States Patent
Rajwade et al.

(10) Patent No.: US 9,703,494 B1
(45) Date of Patent: Jul. 11, 2017

(54) METHOD AND APPARATUS FOR PROTECTING LOWER PAGE DATA DURING PROGRAMMING IN NAND FLASH

(71) Applicant: Intel Corporation, Santa Clara, CA (US)

(72) Inventors: Shantanu R. Rajwade, Sunnyvale, CA (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/276,080

(22) Filed: Sep. 26, 2016

(51) Int. Cl.
| | | |
|---|---|---|
| G11C 7/10 | (2006.01) | |
| G06F 3/06 | (2006.01) | |
| G11C 11/56 | (2006.01) | |
| G11C 16/34 | (2006.01) | |
| G06F 11/10 | (2006.01) | |
| G11C 29/52 | (2006.01) | |

(52) U.S. Cl.
CPC ............ *G06F 3/0611* (2013.01); *G06F 3/064* (2013.01); *G06F 3/0619* (2013.01); *G06F 3/0679* (2013.01); *G06F 11/1068* (2013.01); *G11C 11/5628* (2013.01); *G11C 11/5642* (2013.01); *G11C 16/3459* (2013.01); *G11C 29/52* (2013.01)

(58) Field of Classification Search
CPC . G11C 16/0483; G11C 11/5628; G11C 16/10; G11C 8/08
See application file for complete search history.

(56) References Cited

U.S. PATENT DOCUMENTS

| | | | | |
|---|---|---|---|---|
| 2005/0141283 | A1* | 6/2005 | Lee .................... | G11C 16/0483 365/185.28 |
| 2006/0092703 | A1* | 5/2006 | Chae .................... | G11C 16/10 365/185.18 |
| 2008/0183951 | A1* | 7/2008 | Lee .................... | G11C 16/3454 711/103 |
| 2009/0016107 | A1* | 1/2009 | Kim .................... | G11C 16/34 365/185.05 |
| 2011/0096601 | A1* | 4/2011 | Gavens ............... | G11C 11/5628 365/185.09 |
| 2011/0194353 | A1* | 8/2011 | Hwang ............... | G11C 11/5628 365/185.19 |
| 2013/0028021 | A1* | 1/2013 | Sharon ............... | G11C 11/5642 365/185.17 |
| 2014/0254264 | A1* | 9/2014 | Dutta ................. | G11C 16/3459 365/185.03 |

(Continued)

*Primary Examiner* — Tuan T Nguyen
(74) *Attorney, Agent, or Firm* — Patent Capital Group

(57) ABSTRACT

In one embodiment, an apparatus comprises a storage device comprising a NAND flash memory. The storage device is to store a first page of data in a plurality of cells of the NAND flash memory in a first programming pass; and preserve the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

20 Claims, 5 Drawing Sheets

(56) References Cited

U.S. PATENT DOCUMENTS

2015/0043275 A1 2/2015 Srinivasan et al.
2015/0085575 A1* 3/2015 Tam ................ G11C 29/50004
                                                                                   365/185.11

* cited by examiner

METHOD AND APPARATUS FOR PROTECTING LOWER PAGE DATA DURING PROGRAMMING IN NAND FLASH

FIELD

The present disclosure relates in general to the field of computer development, and more specifically, to NAND flash memory.

BACKGROUND

A computer system may include one or more central processing units (CPUs) coupled to one or more storage devices. A CPU may include a processor to execute an operating system and other software applications that utilize the storage devices coupled to the CPU. The software applications may write data to the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
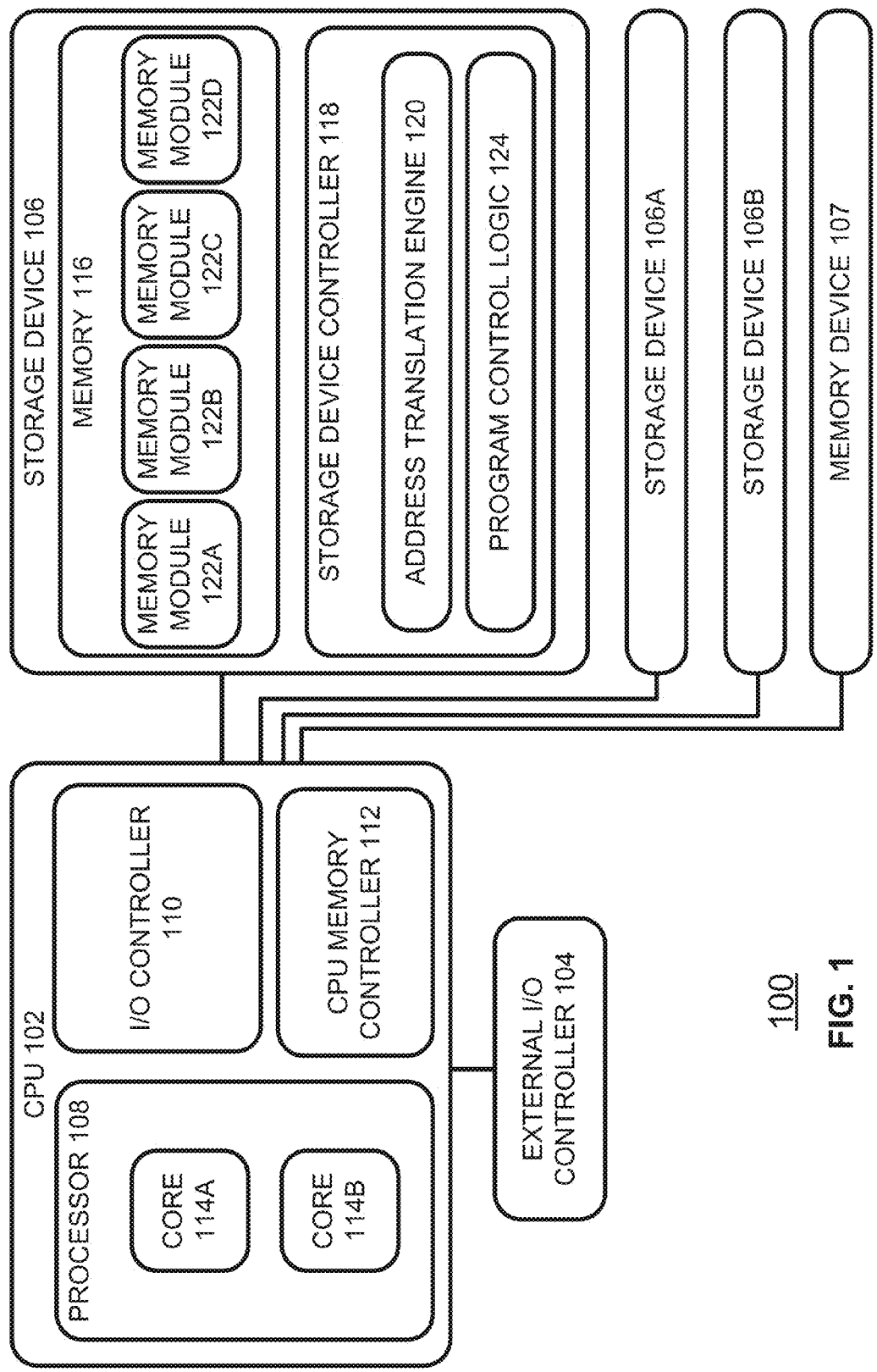
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a plurality of storage devices 106, 106A, and 106B (106A and 106B may perform in similar manners to storage device 106 and/or may have any suitable characteristics of storage device 106), and memory device 107. During operation, data may be transferred between storage devices 106 or memory device 107 and the CPU 102. In various embodiments, particular data operations involving a storage device 106 or memory device 107 may be managed by an operating system or other software application executed by processor 108.

In various embodiments, a storage device 106 comprises NAND flash memory. In some embodiments, storage device 106 may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array.

A program (i.e., write) sequence for a NAND flash memory generally includes numerous program loops to program cells of memory. A program loop generally includes application of one or more program voltages (e.g., pulses) followed by one or more program verify voltages (e.g., pulses). The program voltage(s) may be stepped higher in every subsequent program loop to allow or assist slower-to-program cells to reach their respective target threshold voltage levels. Cells reaching their respective target levels (as determined via the program verify voltages) are inhibited in all subsequent program pulses such that they may maintain their programmed threshold voltages. Program loops may continue to be performed until all (or most) cells being programmed reach their target threshold voltage. Cells that do not reach their target threshold voltage may be fixed via an error correction code (ECC) capability of the memory.

In various embodiments, multi-level cell programming (in which the cells of a NAND flash memory each store two or more bits) may be performed in more than one pass. The first pass programs one or more lower page(s)/bit(s) in the group of cells and one or more subsequent passes program the higher pages(s)/bit(s) in the same group of cells. A page is readable if there is sufficient margin between adjacent levels of threshold voltage distributions corresponding to bit values of the page (such margins are described in more detail in connection with FIGS. 3 and 4). In general, a single page may be read from cells storing multiple pages after complete programming of the first pass (which stores the lower bit(s)/page(s)) as well as one or more subsequent passes (which store the higher bit(s)/page(s)). However, if the program sequence is interrupted during the one or more subsequent passes (e.g., in the event of a power loss), the lower page(s) may become unreadable due to the programming of the higher pages causing particular cells (e.g., cells that transition to higher threshold voltages more quickly than others) to cross over a read voltage threshold used to distinguish between values of the lower page(s). In other words, there is a possibility of corruption of the lower page(s) data if the program operation of the higher pages(s) is started but not completed.

Various embodiments of the present disclosure provide the ability to ensure the readability of the lower page(s) of data throughout the programming sequence, even if the sequence is aborted after the lower page(s) are programmed and before the programming of the upper page(s) is complete. Particular embodiments include application of multi-pulse programming (MPP) techniques that can ensure the maintenance of suitable margins between adjacent levels of threshold voltage distributions throughout the course of programming. Particular embodiments may reduce the programming time relative to other solutions that try to achieve lower page(s) immunity to power loss during upper page(s) programming by placing the levels in the lower page(s) further away from each other (i.e., placing first pass threshold voltage distributions more tightly which generally results in increased programming time due to the finer program voltages that are used). Various embodiments of the present disclosure may provide technical advantages, such as providing readability of written data despite program interruption, reducing programming time, and other technical advantages.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more memory devices 107. CPU memory controller 112 may include logic operable to read from a memory device 107, write to a memory device 107, or to request other operations from a memory device 107. In various embodiments, CPU memory controller 112 may receive write requests from cores 114 and/or I/O controller 110 and may provide data specified in these requests to a memory device 107 for storage therein. CPU memory controller 112 may also read data from a memory device 107 and provide the read data to I/O controller 110 or a core 114. During operation, CPU memory controller 112 may issue commands including one or more addresses of the memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A memory device 107 may store any suitable data, such as data used by processor 108 to provide the functionality of computer system 100. For example, data associated with programs that are executed or files accessed by cores 110 may be stored in memory device 107. Thus, a memory device 107 may include a system memory that stores data and/or sequences of instructions that are used or executed by the cores 114. In various embodiments, a memory device 107 may store persistent data (e.g., a user's files or instruction sequences) that remains stored even after power to the memory device 107 is removed. A memory device 107 may be dedicated to a particular CPU 102 or shared with other devices (e.g., one or more other processors or other device) of computer system 100.

In various embodiments, a memory device 107 may include a memory comprising any number of memory modules, a memory device controller, and other supporting logic (not shown). A memory module may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114 may be stored in storage device 106. Thus, in some embodiments, a storage device 106 may include a system memory that stores data and/or sequences of instructions that are used or executed by the cores 114. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising a plurality of memory modules 122A-D, however, a storage device may include any suitable number of memory modules 122. A memory module 122 includes a plurality of memory cells that are each operable to store one or more bits. The cells of a memory module 122 may be arranged in any suitable fashion, such as in rows (e.g., wordlines) and columns (e.g., bitlines), three dimensional structures, or other manner. In various embodiments, the cells may be logically grouped into banks, blocks, subblocks, wordlines, pages, frames, bytes, or other suitable groups. In various embodiments, a memory module 122 comprises one or more NAND flash memory arrays. NAND flash memory arrays are described in more detail in connection with FIG. 2.

A memory module 122 may include non-volatile memory, such as planar or 3D NAND flash memory. Non-volatile memory is a storage medium that does not require power to maintain the state of data stored by the medium. In particular embodiments, a memory module 122 with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices 106 that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

Storage devices 106 may comprise any suitable type of memory and are not limited to a particular speed, technology, or form factor of memory in various embodiments. For example, a storage device 106 could be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices 106. Storage devices 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. Storage devices 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to memory 116, and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same chip, board, or device as memory 116 or on a different chip, board, or device. For example, in some environments, storage device controller 118 may be a centralized storage controller that manages memory operations for multiple different memories 116 (which could each be of the same type or could be of different types) of computer system 100 (and thus could provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip as the storage device controller 118 or on a different chip.

In various embodiments, address translation engine 120 may include logic to store and update a mapping between a logical address space (e.g., an address space visible to a computing host coupled to the storage device 106) and the physical address space of the memory 116 (which may or may not be exposed to the computing host). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within memory 116) of the storage device 106, such as an identifier of the memory module 122 on which the physical memory location is located, one or more pages of the physical memory location, one or more subblocks of the physical memory location, one or more wordlines of the physical memory location, one or more bitlines of the physical memory location, or other suitable identifiers or encodings thereof.

The address translation engine 120 or other portion of storage device 106 may include any suitable memory type for storing logical to physical mapping structures and other information and any suitable logic for changing values stored in the logical to physical mapping structures and other information (e.g., in response to a request from the storage device controller 118) and reading values from the logical to physical mapping structures and other information (e.g., to provide the values to the storage device controller 118 for use in memory operations).

Storage media for the logical to physical mapping structures and other information may be included within the address translation engine 120 and/or storage device controller 118 or may be communicably coupled to the address translation engine and/or storage device controller. In various embodiments, storage media for the logical to physical mapping structures and other information may be integrated on the same chip as the storage device controller 118 and/or address translation engine 120 or may be implemented on a separate chip.

In various embodiments, the address translation engine 120 and/or storage device controller 118 may provide wear leveling through management of the address mappings of the logical to physical mapping structures and other information. In particular embodiments, the address translation engine 120 and/or storage device controller 118 may also prevent the use of bad memory cells (or logical grouping of cells) by not allowing physical addresses for the bad cells (or logical grouping of cells) to be mapped to the logical address space.

In various embodiments, the storage device 106 also includes program control logic 124 which is operable to control the programming sequence performed when data is written to memory 116. In various embodiments, program control logic 124 may provide the various voltages that applied to the memory cells during the programming and/or reading of one or more pages of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same chip as memory 116 and/or memory modules 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die or package (i.e., on-chip) or any of the elements of CPU 102 may be located off-chip. Similarly, the elements depicted in storage device 106 may be located on a single chip or on multiple chips. In various embodiments a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
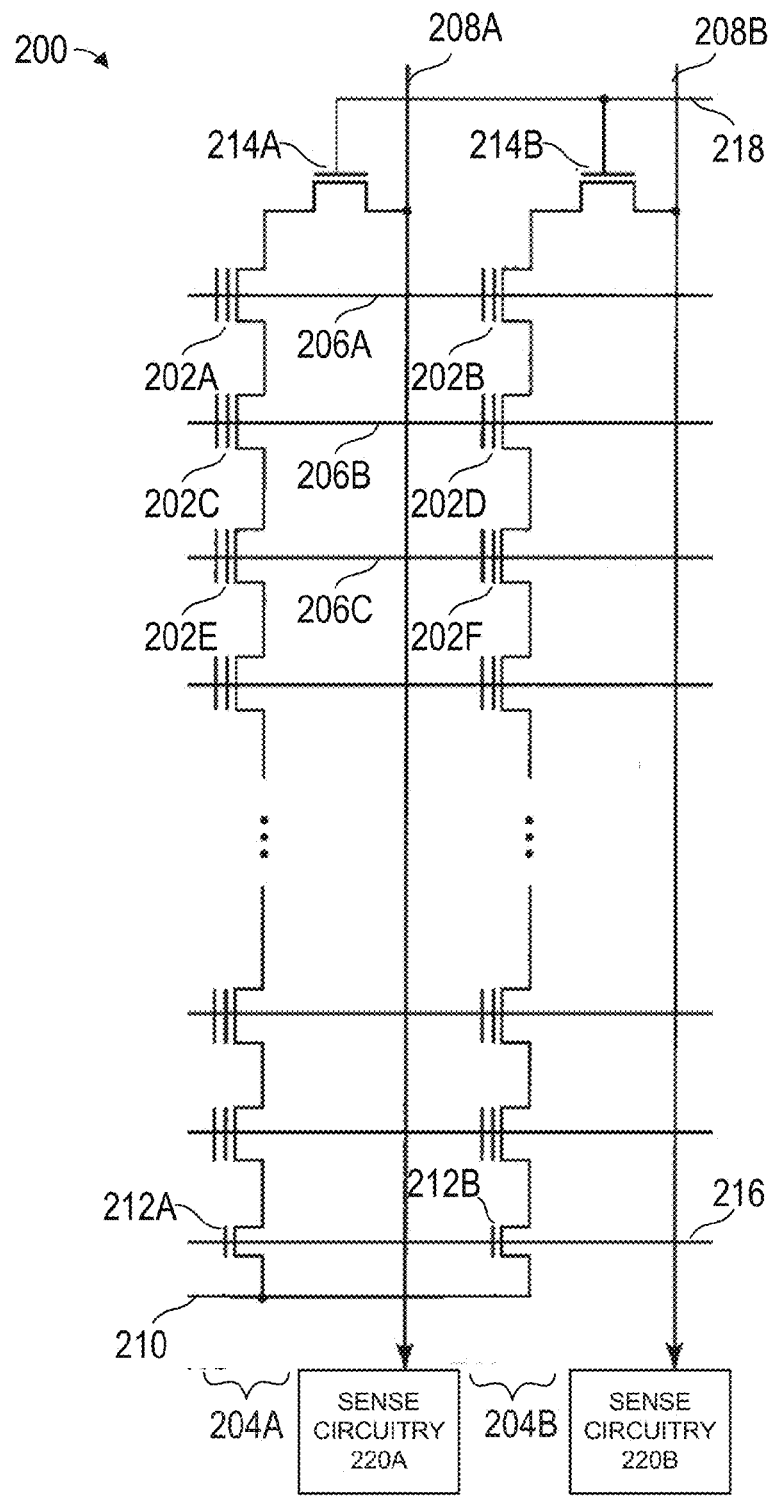
FIG. 2 illustrates an example diagram of a portion of a NAND flash memory array in accordance with certain embodiments.

FIG. 2 illustrates an example diagram of a portion of a NAND flash memory array 200 in accordance with certain embodiments. NAND flash memory array 200 may comprise a plurality of non-volatile memory cells 202 arranged in columns such as series strings 204. In various embodiments, a memory cell 202 may comprise a transistor with a floating gate that stores charge indicative of one or more bit values stored by the memory cell 202. In the series strings 204, the drains of the cells 202 are each (with the exception of the top cell) coupled to a source of another cell 202.

The array 200 also includes wordlines 206. A wordline 206 may span across multiple series strings 204 (e.g., a wordline may be coupled to one memory cell of each series string 204) and are connected to the control gates of each memory cell 202 of a row of the array 200 and used to bias the control gates of the memory cells 202 in the row. The bitlines 208 are each coupled to a series string 204 by a drain select gate 214 and sensing circuitry 220 that detects the state of each cell by sensing voltage or current on a particular bitline 208.

Each series string 204 of memory cells is coupled to a source line 210 by a source select gate 212 and to an individual bitline 208 by a drain select gate 214. The source select gates 212 are controlled by a source select gate control line 216 and the drain select gates 214 are controlled by a drain select gate control line 218.

Figure 3:
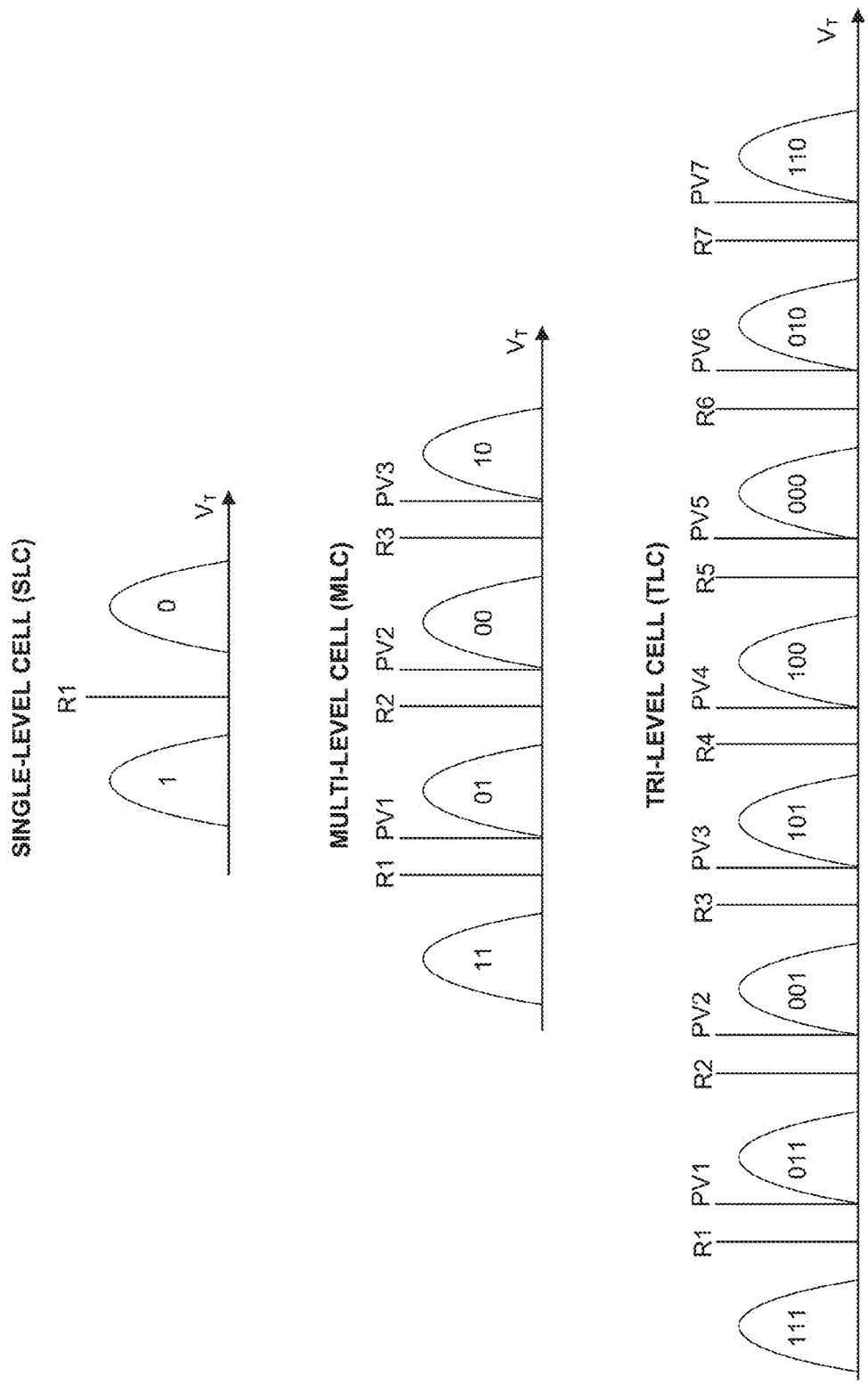
FIG. 3 illustrates example encoding schemes for NAND flash memory cells in accordance with certain embodiments.

In various embodiments, each memory cell 202 can be programmed according to an SLC, MLC, TLC, a QLC, or other encoding scheme. Each cell's threshold voltage (Vt) is indicative of the data that is stored in the cell. FIG. 3 illustrates example encodings of bits within NAND flash memory cells 202 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted regions. In other words, a program level may correspond to one of the bit encodings in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, ...) represent read voltages that may be applied to a wordline when the values of the cells are being read. When a particular read voltage is applied, sense circuitry 220 may determine whether the threshold value of a cell is greater than or less than the read voltage based on a voltage or current sensed by the sense circuitry 220 via the bitline of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry 220 determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry 220 determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droopage over time and to improve sensing accuracy. For example, the figure depicts a margin in between R1 and PV1, between R2 and PV2, and so on.

In particular embodiments, cells may be programmed a page at a time, where a page is stored in a group of cells that are coupled to the same wordline. For example, the group of cells may be identified by a particular wordline and a particular subblock. As another example, the group of cells may represent all of the cells of the wordline. The group of cells may store one page of data (if the cells are encoded according to an SLC scheme) or multiple pages of data (if the cells are encoded according to an MLC, TLC, QLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline. For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A programming sequence for a group of cells may comprise programming of all of the intended pages into the group of cells. A programming sequence may include one or more programming passes. A programming pass (which may comprise one or more programming loops) may encode one or more pages. A programming pass may comprise the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). In some embodiments, one or more loops of a programming pass may comprise the application of one or more effective program voltages without the application of one or more verify voltages. The application of an effective program voltage to a cell may include changing the voltage difference between a control gate and a channel of the cell in order to change the threshold voltage of the cell. Thus, the voltage of a wordline (coupled to the control gate of the target cell) and/or a channel of the cell may be set in order to effectuate application of an effective program voltage. As a "program voltage" is commonly used to refer to a voltage applied to a wordline, the term "effective program voltage" will be used herein to refer to the voltage difference between a control gate and channel of a cell (which in instances where the channel is held at 0 V will be synonymous with program voltage).

As mentioned above, a programming pass may program one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is slightly greater than PV2 in the first programming pass (or at least a portion of the way to PV2 so as to be distinguished from cells that are left in a low voltage erased state). If a particular rightmost bit is to be stored as a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP. As other examples, when the cells of a wordline are encoded using a TLC scheme or a QLC scheme, all pages may be programmed during a single programming pass by setting the voltage levels of the cells to the desired program level, or one or more of the pages may be programmed during a first pass and the remaining pages programmed during a second pass (or the remaining pages may be programmed using multiple additional passes). For example, in a TLC scheme, a first pass may encode an LP and a second pass may encode the UP and the XP. As another example, in a QLC scheme, a first pass may encode an LP and a UP and a second pass may encode the XP and the TP or a first pass may encode the LP and a second pass may encode the UP, XP, and TP.

As used herein, lower page(s) may be used to refer to one or more pages that are programmed in a first programming pass and upper page(s) may be used to refer to one or more pages that are programmed in one or more subsequent programming passes. These designations may be distinguished from the Lower Page and Upper Page previously described (in general a Lower Page will be a lower page as used herein when multiple programming passes are used while an Upper Page may be a lower page or an upper page depending on whether it is programmed in the first programming pass or in a subsequent programming pass). Thus, in an MLC scheme, a lower page (e.g., the LP) may be programmed in a first programming pass and an upper page (e.g., the UP) may be programmed in a second programming pass. As another example, in a TLC scheme, a lower page (e.g., the LP) may be programmed in a first programming pass and upper pages (e.g., the UP and the XP) may be programmed in a second programming pass. As another example, in a QLC scheme, a lower page (e.g., the LP) may be programmed in a first programming pass and upper pages (e.g., the UP, XP, and TP) may be programmed in a second programming pass. As another example, in a different QLC scheme, lower pages (e.g., the LP and the UP) may be programmed in a first programming pass and upper pages (e.g., the XP and the TP) may be programmed in a second programming pass. Any other suitable permutations of pages programmed in programming passes is contemplated in this disclosure including multiple passes being used to program the upper pages.

In various embodiments, one or more lower pages may be programmed coarsely in a first programming pass to reduce the amount of program loops performed and corresponding program time. In various embodiments, this may involve one or more program loops designed to move the fastest to program cells being programmed close to one or more particular program verify voltage levels (in various embodiments the cells are moved close to but not above the target program verify voltage level in order to avoid overshooting the target program level when the programming of the upper page(s) is performed). For example, in the MLC scheme, an LP may be programmed in a first pass and a UP in a second pass. After the first pass, the threshold voltages of the cells that are being programmed to a 0 value for the LP (i.e., the cells that are going to eventually be placed within the second program level having value "00" or the third program level having value "10") may have threshold voltages ranging from near PV2 back to the left (some cells may even be in the first program level depending on how wide the distribution of the Vts of the programmed cells). As another example, in the TLC scheme, if the LP is programmed during the first pass, the threshold voltages of the cells that are being programmed to a 0 value for the LP (i.e., the cells that are going to eventually be placed within the fourth program level having value "100", the fifth program level having value "000", the sixth program level having value "010", or the seventh program level "110") may be distributed from near PV4 back to the left (some cells may be in the third or even the second program level depending on how wide the distribution is). If multiple pages are programmed during the first programming pass, then multiple groups of cells may be coarsely programmed such that the fastest to program cells of each group are placed near the appropriate target threshold voltage level. For example, in the TLC scheme, if the LP and UP were programmed in a first pass, the fastest to program cells of one group may be placed a little lower than PV2, the fastest to program cells of a second group may be placed a little lower than PV4, and the fastest to program cells of a third group may be placed a little lower than PV6 (while the remaining cells are not programmed and remain in an erased state). Similar coarse programming may be used in other schemes such as QLC encoding.

In particular embodiments, if multiple programming passes are used to program the cells of a first wordline, one or more programming passes may be performed on one or more adjacent wordlines after an initial programming pass is performed on the first wordline and before an additional programming pass is performed on the first wordline. Such embodiments may mitigate the effects of interference caused to cells by the programming of neighboring wordlines. In other embodiments, multiple passes may be performed on the cells of a wordline before the next wordline is programmed.

In particular embodiments, a logical page of data (i.e., a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106, if multiple pages are to be programmed in a single pass, multiple logical pages from the computing host may be aggregated and programmed in the pass. For example, in memory encoded using a TLC scheme, when the LP and UP are programmed in a single pass, two logical pages of data may be aggregated (where one logical page is stored in the LP and one logical page is stored in the UP).

A single-pulse programming (SPP) scheme may utilize a waveform with a single program pulse which is applied to cells (e.g., via a wordline of the cells) to move the Vts of all the cells that are below their destined program verify voltage (i.e., the cells that have not yet reached their targeted program level). A multi-pulse programming (MPP) scheme may apply two (or more) effective program voltages to cells during a single program loop, where each effective program voltage is applied to a group of cells targeted towards different program levels. Thus, a typical program loop in an MPP scheme may involve application of a first effective program voltage to a first group of cells, then application of a second effective program voltage to a second group of cells, then activation of additional effective program voltages to additional groups of cells (if applicable), and then application of one or more program verify voltages to determine which cells have reached their targeted voltage levels. In various embodiments, one or more of the MPP program loops may omit the application of the program verify voltages.

In a MPP scheme, a single waveform comprising multiple program voltages is applied to a wordline during a program loop. The multiple program voltages may each be applied to a distinct group of cells. For example, the waveform may ramp up (or down) to a first program voltage which is applied to a first group of cells of the wordline (while a second group of cells is inhibited) and then ramp up (or down) to a second program voltage which is applied to a second group of cells of the wordline (while the first group of cells is inhibited). A waveform may comprise any number of different program voltages and may ramp up or down at any point in the waveform to reach these voltages. When a program voltage is applied to a group of cells, all remaining cells of the wordline may be inhibited. As one example, if cells are to be programmed to three different levels (e.g., in an MLC scheme, one group of cells is not programmed and the other groups are each programmed to one of three different program levels), then an MPP wordline waveform may comprise three different program voltages, with the lower program voltage being applied to cells destined for the first program level, the next highest program voltage being applied to cells destined for the second program level, and the highest program voltage being applied to cells destined for the third program level. In successive program loops, the program voltages in the waveform may be stepped up (e.g., by the same amount or by different amounts). For example, if a first program loop comprised a first program voltage of 20 V, a second program voltage of 21 V, and a third program voltage of 22V; a second program loop may use a waveform that comprises a first program voltage of 21V, a second program voltage of 22V, and a third program voltage of 23 V; a third program loop may use a waveform that comprises a first program voltage of 22V, a second program voltage of 23V, and a third program voltage of 24 V and so on. The program voltages may be stepped up in successive loops until programming is completed.

In a second MPP scheme, the channel voltages of cells destined to various levels are boosted appropriately and then a single program voltage is applied to the wordline of the cells. The channel-to-control gate voltage difference determines the programmed Vt of the cell. Therefore, a cell having a channel boosted to a higher voltage (e.g., 2 V) compared to an unboosted cell (e.g., having a channel voltage of 0 V) will be programmed to a lower Vt (e.g., ~2 V lower Vt in this example). Channel boosting can be achieved by appropriate sequencing of the voltages on the bitlines of these cells and the unselected wordlines. As an example, if the boost voltage in the channel is to be set to 2 V, the bitline voltage for that cell is maintained at 0 V until the voltage on the unselected wordlines reaches 2V lower than their final target voltage. Subsequently, the bitline voltage is raised, so that the selector device can no longer conduct the bitline voltage to the channel. In other words, the channel is left isolated from the bitline (i.e., not electrically connected). Finally, the unselected wordlines are risen through their final 2 V step and the isolated channel capacitively couples to the change in voltage, thereby boosting to 2 V. Now when the programming pulse is applied to the wordline, this cell will be programmed to a Vt that is 2 V lower than what it would have been had the channel remained unboosted.

The channel boost scheme may achieve the same effect as applying a plurality of different program voltages to a wordline. Thus, multiple effective program voltages may be applied to different groups of cells during a single program loop by setting the channels of a first group of cells to a first voltage, the channels of a second group of cells to a second voltage, and so on. In one example, during a first program loop, the channels of a first group of cells may be set to 1V and the channels of the second group of cells may be set to 0V and a program voltage may be applied to the wordline of all of the cells. During a second program loop, the channels may be set to the same voltages and the program voltage applied to the wordline may be stepped up (e.g., by 1V or other suitable value). Alternatively, the voltages applied to the channels could be changed to effectuate differences in the channel-to-control gate voltages relative to the channel-to-control gate voltages applied in the first program loop.

As described above, an effective program voltage may be used herein to refer to the channel-to-control gate voltage difference applied to one or more cells. Thus, if a channel is not boosted (but is held at 0V), the effective program voltage is equal to the program voltage applied to the wordline and if a channel is boosted, the effective program voltage is equal to the difference between the program voltage applied to the wordline and the voltage of the channel. In a single pulse programming scheme, only a single effective program voltage is applied during a program loop to cells being programmed during that loop. In various embodiments, when a single page is programmed during a first pass, an SPP scheme may be used to program the page, and when one or more additional pages are programmed in a subsequent pass an MPP scheme may be used to program the one or more additional pages.

Figure 4:
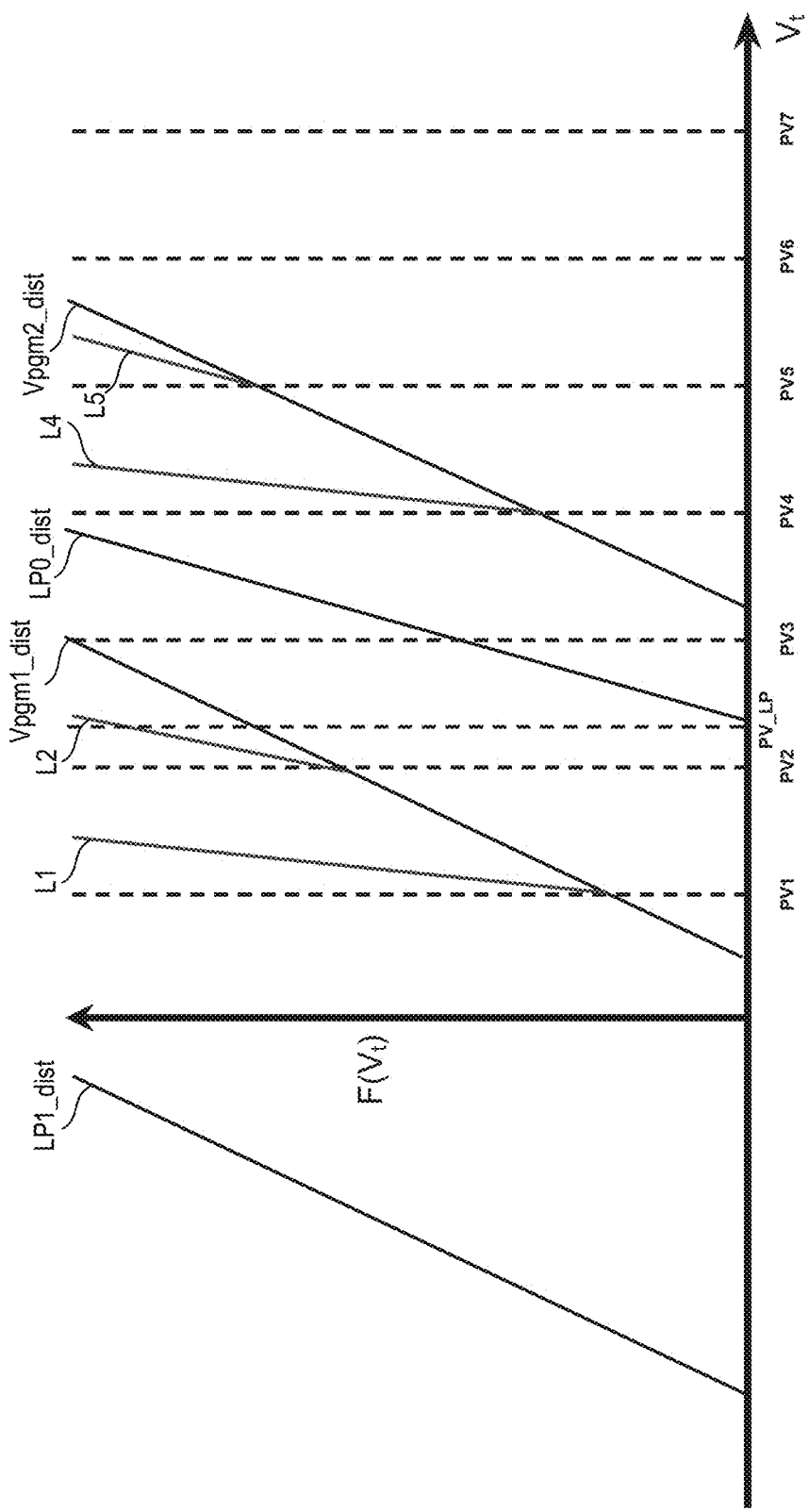
FIG. 4 illustrates an example programming sequence for tri-level cell (TLC) NAND flash memory cells in accordance with certain embodiments.

FIG. 4 illustrates an example programming sequence for TLC NAND flash memory cells in accordance with certain embodiments. The various information depicted by FIG. 4 is not necessarily drawn to scale and may be adapted in any suitable manner depending on the particular implementation. The figure depicts several cumulative distribution functions (CDFs) of threshold voltages of a group of cells (e.g., a page, a wordline, a subblock, an entire array, or other group) under various conditions: LP1_dist, Vpgm1_dist, LP0_dist, Vpgm2_dist.

The CDF of a real-valued random variable X evaluated at x, is the probability that X will take a value less than or equal to x. In the graph depicted in FIG. 4, the x axis is threshold voltage (Vt) and the Y axis is the value of the cumulative distribution function of Vt, expressed as F(Vt), where a value of 0 for F(Vt) at a point means no cells are at or below the corresponding Vt and a value of 1 for F(Vt) at a point means all cells are at or below the corresponding Vt. LP1_dist represents the CDF of threshold voltages of the cells in an erased state while each of CDFs Vpgm1_dist, LP0_dist, and Vpgm2_dist represent the CDF of threshold voltages of the cells after a program voltage (or potentially multiple program voltages in the case of LP0) were to be applied. For example, Vpgm1_dist represents a CDF of the Vts of the cells if a first program voltage were to be applied (without accounting for verification of the cells), Vpgm2_dist represents a CDF of the Vts of the cells if a second program voltage (higher than the first program voltage and again not accounting for verification of cells) were to be applied, and LP0_dist represents a CDF of the Vts of the cells when one or more program voltages are applied to program an LP (e.g., LP0 represents the distribution of the threshold voltages of the cells that are programmed to a value of 0, while the cells that are to be set to value 1 remain in an erased state). The spread in the unverified program Vts of all the cells in the page (i.e., as demonstrated by Vpgm1_dist or Vpgm2_dist) may be termed a single pulse program (SPP) distribution. The expanse of this SPP distribution is the difference in the Vts of the slowest-to-program cells and the fastest-to-program cells at the same program voltage.

The CDF LP0_dist is shown as narrower than the other CDFs (e.g., this may result when a verification process does not allow the faster-to-program cells to exceed PV4 and the slower-to-program cells to be lower than a program verify voltage PV_LP for the lower page), but in other embodiments, the CDF LP0_dist could be the same width as the other CDFs if the verification process were omitted.

Threshold voltages of the cells are determined by numerous factors such as cell geometry, doping concentration in the channel, or other process parameters, which generally tend to be normal Gaussian distributions with associated medians and standard deviations. Accordingly, the CDFs LP1_dist, Vpgm1_dist, and Vpgm2_dist depicted in FIG. 4 increase linearly as a function of Vt. In the particular example where the threshold voltages follow a Gaussian distribution, with each subsequent program pulse, the distribution moves to higher threshold voltages while maintaining the same standard deviation. Various embodiments of the present disclosure are based on the representative Gaussian distribution of the Vts, although the teachings of this disclosure are applicable to any suitable CDF describing the distribution of cell Vts.

As described, the CDFs Vpgm1_dist and Vpgm2_dist represent CDFs that may result when none of the cells are inhibited as the program voltage is successively stepped up (during actual programming, cells are inhibited once they reach their appropriate threshold voltage value). Alternatively, the CDFs may be viewed as the CDFs of groups of remaining uninhibited cells during an actual programming sequence. The result of the inhibiting is partially shown by the L1, L2, L4, and L5 final CDFs which show the partial CDFs for cells programmed to program level 1, program level 2, program level 4, and program level 5 respectively after the programming sequence is complete.

In various embodiments utilizing a TLC scheme, a first pass programs an LP and one or more subsequent pass(es) program the UP and XP. The LP placement (as depicted by LP0_dist) may be coarse, with a relatively wide placement of Vt distribution to save program time. The placement of the UP and XP will be finer than the LP because the number of distinct levels to be placed increases by a factor of four (and ample margins must be maintained between each of these levels in order to correctly read the bit values stored in the cells). The first pass program of the LP separates the cells in the page into two levels (erased cells that aren't programmed and programmed cells that are above a particular threshold voltage shown here as PV_LP). The second pass programming splits the erased distribution (i.e., LP1_dist) and the placed distribution (i.e., LP0_dist) of the LP into four levels each such that each cell is placed in one of the eight levels after programming is complete. Levels 0 through 3 emerge from the distribution of the erased cells of the LP and levels 4 through 7 emerge from the distribution of the placed cells of the LP (i.e., those cells that were programmed during the first pass and shown as LP0). The initial LP placement during the first program pass can be coarse while preserving the readability of the LP due to the large margin (this margin may be roughly 1 V in particular embodiments) between the two levels. In various embodiments, the threshold voltages of the cells that are placed (i.e., programmed) in the first pass do not exceed the program verify voltage (PV) of the lowest level emerging from the LP placement during second pass programming, which in this case is the PV for level 4 (PV4). To allow for a relatively wide distribution during the first pass, the PV voltage for the LP (PV_LP) is placed lower than the PV of the highest level emerging from the erased distribution during the second programming pass, which in this case is the PV for level 3 (PV3).

During the course of the second pass programming, if a single program voltage were used, cells emerging from the erased distribution and targeted to level 3 could have higher Vts than cells emerging from the LP placed distribution, since the program voltage may not be sufficiently high to move the Vts of the slower-to-program cells of the placed distribution of the LP (e.g., the cells that are near PV_LP after the first pass). In the event of power loss during such an intermediate state, the LP data is not readable, because there is no LP read voltage that will distinguish the placed cells from the erased cells in the LP (because the faster-to-program cells from the erased distribution will have higher threshold voltages than the slower-to-program cells from the placed distribution).

While the PV_LP for the LP distribution could be placed higher than PV3 to avoid such an issue, this would result in finer program voltage steps during the first pass programming to accomplish a tighter placement of the LP (since LP0_dist would be narrower). Since the Vts of the placed cells of the LP are higher than PV3, there would a positive read margin for any intermediate loop during the second pass programming (thereby avoiding LP data corruption in the event of power loss), but the finer placement of LP0_dist would result in slower effective program time due to the larger number of program loops used to accomplish a narrower window.

In various embodiments, an MPP scheme (such as any of the schemes described above or other suitable method for applying multiple effective program voltages during a single program loop) is used to preserve the readability of one or more lower pages programmed in a first programming pass in the event that the second programming pass (or other subsequent programming pass) is interrupted before completion. After one or more lower pages are stored in a plurality of cells in a first pass, the readability of the lower page(s) of data in the plurality of cells is preserved during one or more subsequent programming passes that each comprise a plurality of program loops. When a single page was programmed during the first pass, at least some of the program loops of a second pass (or other subsequent pass) may include application of a first effective program voltage to a first group (i.e., distribution) of cells of the plurality of cells (to further program the first group into two or more program levels) and application of a second effective program voltage to a second group of cells of the plurality of cells (to further program the first group into two or more program levels). If two lower pages (e.g., an LP and UP in a TLC or QLC scheme) were programmed during the first pass, then at least some of the program loops of the second pass (or other subsequent pass) may additionally include application of a third effective program voltage to a third group of cells and application of a fourth effective program voltage to a fourth group of cells (since in order to program two pages of data there would be four different groups (i.e., distributions) of cells where each group represents "00", "01", "10", or "11").

When a single page is programmed during the first pass, program loops of the second pass may include application of a first effective program voltage to a group of cells that were not programmed in the first programming pass (e.g., the erased cells that represent values of "1") and application of a second effective program voltage to a group of cells that were programmed in the first programming pass (e.g., the placed cells that represent values of "0"). When two pages were programmed during the first pass, program loops of the second pass may include application of a first effective program voltage to a group of cells that were not programmed in the first programming pass (e.g., the erased cells that represent values of "11"), a second effective program voltage to a group of cells that were programmed to represent values of "01", a third effective program voltage to a group of cells that were programmed to represent values of "10", and a fourth effective program voltage to a group of cells that were programmed to represent values of "00". The various effective program voltages may be applied in any suitable manner, such as those described above with respect to the MPP schemes (e.g., different voltages may be applied to the control gates of the cells of the groups while the channel voltages of the cells of all groups are held constant or different voltages can be applied to the channels of the cells of the groups while the control gate voltages of the cells of all groups are held constant) or other suitable schemes.

In various embodiments, the various effective program voltages may be stepped up from one program loop to the next. For example, if the first effective voltage applied in a first program loop of the second pass is 20V and the second effective voltage applied in the first program loop is 23V, the first effective voltage applied in a second program loop may be 21V and the second effective voltage applied in the second program loop may be 24V (all values listed herein are for example purposes only). In various embodiments, the effective program voltages are each stepped up by the same amount from one programming pass to the next (such that the difference between any two effective program voltages remains constant throughout the programming pass). In other embodiments, the amounts at which the different effective voltages are stepped up may vary from one effective program voltage to another.

The embodiment depicted in FIG. 4 demonstrates how an LP read margin may be maintained during every loop of the second pass programming. As described above, the spread in the unverified program Vts of all the cells in the page (i.e., as demonstrated by Vpgm1_dist or Vpgm2_dist) may be termed a single pulse program (SPP) distribution. The expanse of this SPP distribution is the difference in the Vts of the slowest-to-program cells and the fastest-to-program cells at the same program voltage. As long as the expanse of the SPP distribution is lower than the difference between the two effective program voltages (which may in some embodiments may be set to the difference between PV4 and PV1), the fastest cell emerging from the erased distribution of the LP and targeted to level 3 (from the first effective program voltage) is guaranteed to have a lower Vt than the slowest cell emerging from the LP placed distribution targeted to any level (from the second effective program voltage). In other words, due to the concurrent (i.e., within the same program loop) movement of the threshold voltages of the cells in both groups, cells destined to levels 1 through 3 are always guaranteed to have lower Vts compared to cells destined to levels 4 through 7 at any intermediate program loop during the second pass (in spite of the relatively wide distribution of the placed cells of the LP and the PV_LP being below PV3). Accordingly, the data of the LP is protected against corruption by power loss during the second pass programming. Furthermore, due to the concurrent programming approach (wherein cells of both groups may each be programmed in the same program loop), the total number of program loops in the second pass programming is reduced, thus reducing the effective program time.

In various embodiments, the effective program voltages to be applied during a program loop to different groups of cells may be applied in order of magnitude, such that the highest effective program voltage is applied first, the next highest effective program voltage is applied second, and so on (if more than two effective program voltages are to be applied in the same loop). Such a method may provide additional margin between the different cell distributions of the lower page(s) (e.g., in the event that the programming is interrupted during or after application of the first effective program voltage). Similarly, additional read margin may be obtained by performing at least one program loop wherein an effective program voltage is applied to one group of cells (e.g., the placed distribution of the LP when a single page is programmed during the first pass or the group of cells with the highest Vts when two pages are programmed during the first pass) but all of the cells in the other groups are inhibited. For example, if the CDF of the cells has a wide expanse (i.e., there is a large Vt difference between the slowest-to-program cells and the fastest-to-program cells), one or more of the groups of cells may be shifted higher (in terms of Vt) before the lower group moves higher in order to guarantee that faster-to-program cells of the lower group do not overtake the slower-to-program cells of the higher group.

As an example, if the expanse of the SPP distribution (i.e., Vpgm1_dist or Vpgm2_dist) is higher than PV4-PV1, the MPP approach described herein may still be used, but the performance upside may be slightly reduced. Referring to the embodiment of FIG. 4, in the first few program loops, only levels 4 through 7 are programmed, thereby increasing their cell Vts (and the magnitude of the second effective voltage). When the second effective voltage becomes sufficiently high, such that the difference between the second effective voltage and the first effective voltage is greater than PV4-PV1, level 1 through 3 may begin programming to maintain the LP read valley at any intermediate loop.

In the embodiment depicted in FIG. 4, a single page has been programmed during the first pass (the distribution of the cells after the first pass are shown as LP1 and LP0). During the second pass, the UP and the XP are programmed. In this particular example, at least some of the program loops of the second programming pass involve applying a first effective program voltage to cells targeted to program levels 1 through 3 and applying a second (higher) effective program voltage to cells targeted to levels 4 through 7 (though not necessarily in that order). Both effective program voltages may be stepped by the same amount in each subsequent loop. In various embodiments, the difference between the voltages of the two effective program voltages in any given loop is PV4-PV1 (which in some embodiments may be ~2 V). With such a relationship, cells targeted to level 4 may be placed simultaneously (i.e., during the same program loop) with cells targeted to level 1, cells targeted to level 5 may be placed simultaneously with cells targeted to level 2, and so on.

The techniques described herein with respect to FIG. 4 may be used in other encoding schemes. For example, when MLC encoding is used, a first pass may coarsely program the LP, and an MPP scheme may be used during the second pass to apply a first effective voltage to a first group (comprising the erased cells of the LP) and a second effective voltage to a second group (comprising the placed cells of the LP) to further program each group into two groups. As another example, when QLC encoding is used, a first pass may coarsely program the LP, and an MPP scheme may be used during the second pass to apply a first effective voltage to a first group (comprising the erased cells of the LP) and a second effective voltage to a second group (comprising the programmed cells of the LP) to further program each group into eight different groups. The techniques may further be adapted for embodiments where two lower pages are coarsely programmed during a first programming pass (in which case four different effective program voltages may be applied in a single loop) or for other suitable embodiments.

If the programming is interrupted during the second pass programming (or a subsequent pass), the lower page(s) may be read in any suitable manner. Because the voltage margin that separates the fastest-to-program cells from one group (e.g., the erased distribution of the LP) from the slowest-to-program cells of the next group (e.g., the placed distribution of the LP) shifts as the Vts move upward during programming, various embodiments may perform a sweep through various read voltages in order to determine a suitable read voltage that may be used to read the values of the lower page (or three read voltages when two lower pages are being read). For example, the read voltages may be swept from low to high and when a voltage margin is found that does not contain any cells with Vts in the read margin, the read voltage may be set to a level within the read margin. Any other suitable means may be used to determine one or more read voltages to be used to read the lower page(s) when programming is interrupted.

Figure 5:
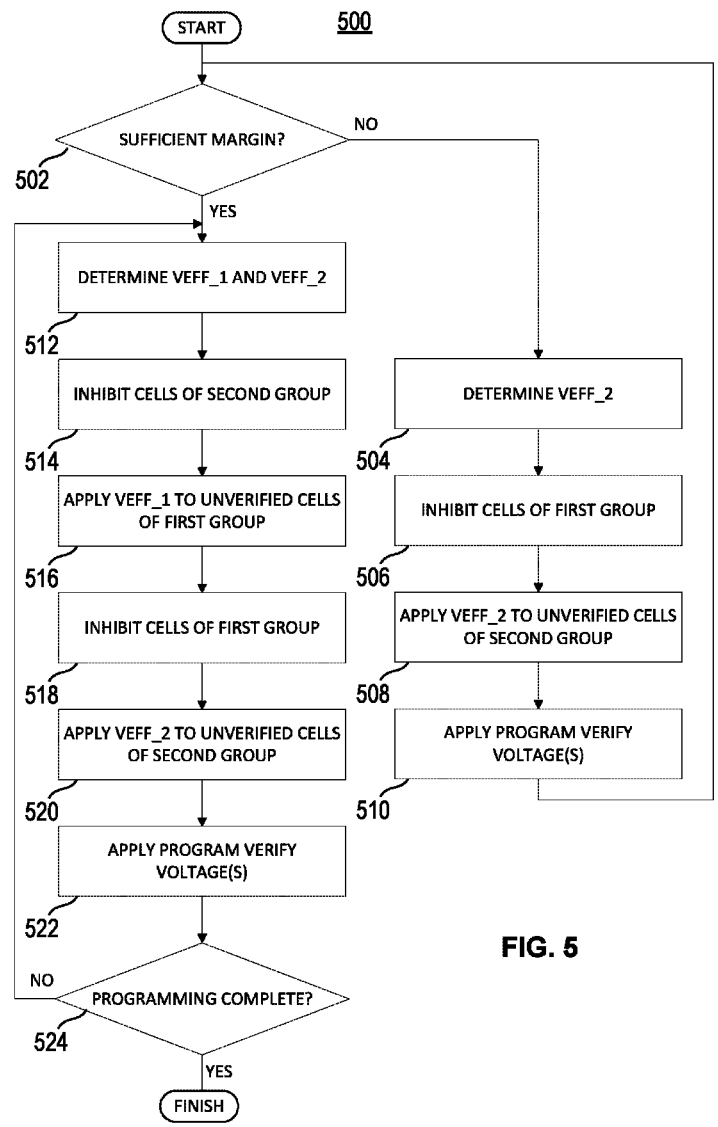
FIG. 5 illustrates an example flow for programming NAND flash memory cells in accordance with certain embodiments.

FIG. 5 illustrates an example flow for programming NAND flash memory cells in accordance with certain embodiments. The flow 500 depicts example operations that may be performed by any suitable logic, such as one or more components (e.g., program control logic 124 and/or storage device controller 118) of a storage device 106 or other suitable logic. Although flow 500 is directed towards a scheme in which a single lower page was programmed during a first programming pass, the flow may be adapted for other schemes in which multiple lower pages are programmed during a first programming pass.

At 502, if sufficient margin does not exist between two groups of cells (e.g., a first group that was not programmed during the first program pass and a second group that was programmed during the first program pass), the flow passes to 502. In one example, a determination of whether sufficient margin exists may be based on an expanse of an SPP distribution of the cells (e.g., a voltage difference between the slowest-to-program cells and the fastest-to-program cells of a group of cells) and a difference between a first effective program voltage (Veff_1) and a second effective program voltage (Veff_2) to be used during the second pass. If the expanse of the SPP is greater than the difference between the effective program voltages, then ample margin does not exist and the flow moves to 504. At 504, the first program loop begins as a value for the second effective voltage is determined. The cells of the first group are inhibited at 506 and the determined second effective voltage is applied to any unverified cells of the second group (generally in the first loop, all or most of the cells of the second group are unverified). This operation has the effect of increasing the margin between the first group and the second group. At 510, one or more program verify voltages are applied to determine whether any cells of the second group have been programmed to their target levels. The flow then returns to 502. If sufficient margin still does not exist, another loop is performed where only the second group of cells is programmed via operations 504, 506, 508, and 510.

Once the margin between the first group and second group is sufficient, a program loop in which both groups of cells are programmed is begun. At 512, Veff_1 and Veff_2 are determined. At 514, the cells of the second group are inhibited. At 516, Veff_1 is applied to unverified cells of the first group. At 518, the cells of the first group are inhibited. At 520, Veff_2 is applied to unverified cells of the second group. In various embodiments, the order of the operations may be reversed (e.g., Veff_2 could be applied to the second group of cells prior to the application of Veff_1 to the first group of cells). At 522, one or more program verify voltages are applied to determine which cells have reached their target levels. At 524, it is determined whether programming is complete. Any suitable method may be used to determine whether programming is complete. For example, if a number of unverified cells is below a predetermined threshold, programming may be determined to be complete. If programming is not yet complete, the flow may move back to 512 and another program loop is performed. In the next program loop a new Veff_1 and Veff_2 are determined and applied to the uninhibited cells of the groups. Additional loops may be performed until it is determined that the programming pass is complete at which point the flow ends.

The flow described in FIG. 5 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 5 may be repeated, combined, modified or deleted where appropriate. Additionally, operations may be performed in any suitable order without departing from the scope of particular embodiments.

Although various embodiments have been described with respect to particular encoding schemes (e.g., MLC, TLC, QLC), the teachings of such embodiments may be equally applicable to memories using any suitable encoding levels, including encoding schemes that become feasible in the future.

Furthermore, even though some embodiments are generally discussed with reference to NAND flash, the teachings of the disclosure may be used with any type of non-volatile or volatile memory (such as those types described herein or other types) that have programming characteristics in common with NAND flash (such as programming in multiple passes).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, core 114, I/O controller 110, CPU memory controller 112, storage device 106, memory device 107, memory 116, memory module 122, storage device controller 118, address translation engine 120, program control logic 124, sense circuitry 220, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or m/.ore gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a storage device comprising a NAND flash memory, the storage device to store a first page of data in a plurality of cells of the NAND flash memory in a first programming pass; and preserve the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

In an embodiment, the storage device is further to apply the first voltage to control gates of the first group of cells and apply the second voltage to control gates of the second group of cells. In an embodiment, the storage device is further to step up the first voltage and the second voltage by an equal amount between program loops of the plurality of program loops. In an embodiment, the storage device is further to apply the first voltage to the channels of the first group of cells and the second voltage to the channels of the second group of cells. In an embodiment, the second group of cells comprises at least one cell that, after the first programming pass is completed and before the subsequent programming pass has started, has a threshold voltage that is lower than the threshold voltage of at least one cell of the first group of cells after the subsequent programming pass is completed. In an embodiment, the storage device is further to preserve the readability of the first page of data in the plurality of cells during the subsequent programming pass by performing at least one program loop in which an effective program voltage is applied to cells of the second group, but an effective program voltage is not applied to cells of the first group. In an embodiment, the storage device is further to apply the second voltage to the second group of cells prior to application of the first voltage to the first group of cells during a program loop of the subsequent programming pass. In an embodiment, the storage device is further to apply the first voltage and the second voltage to a wordline coupled to the plurality of cells. In an embodiment, the storage device is further to store a second page of data in the plurality of cells of the NAND flash memory in the first programming pass; and preserve the readability of the second page of data in the plurality of cells during the subsequent programming pass. In an embodiment, the storage device is further to program two additional pages of data in the plurality of cells during the subsequent programming pass. In an embodiment, the storage device is further to read the first page of data after a power loss has interrupted the subsequent programming pass. In an embodiment, the storage device is further to read the first page using a read voltage that is different from a read voltage that would have been used if the subsequent programming pass had completed.

In at least one embodiment a method comprises storing a first page of data in a plurality of cells of a NAND flash memory in a first programming pass; and preserving the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

In an embodiment, the method further comprises applying the first voltage to control gates of the first group of cells and applying the second voltage to control gates of the second group of cells. In an embodiment, the method further comprises stepping up the first voltage and the second voltage by an equal amount between program loops of the plurality of program loops. In an embodiment, the method further comprises applying the first voltage to the channels of the first group of cells and the second voltage to the channels of the second group of cells. In an embodiment, the second group of cells comprises at least one cell that, after the first programming pass is completed and before the subsequent programming pass has started, has a threshold voltage that is lower than the threshold voltage of at least one cell of the first group of cells after the subsequent programming pass is completed. In an embodiment, the method further comprises preserving the readability of the first page of data in the plurality of cells during the subsequent programming pass by performing at least one program loop in which an effective program voltage is applied to cells of the second group, but an effective program voltage is not applied to cells of the first group. In an embodiment, the method further comprises applying the second voltage to the second group of cells prior to application of the first voltage to the first group of cells during a program loop of the subsequent programming pass. In an embodiment, the method further comprises applying the first voltage and the second voltage to a wordline coupled to the plurality of cells. In an embodiment, the method further comprises storing a second page of data in the plurality of cells of the NAND flash memory in the first programming pass; and preserving the readability of the second page of data in the plurality of cells during the subsequent programming pass. In an embodiment, the method further comprises programming two additional pages of data in the plurality of cells during the subsequent programming pass. In an embodiment, the method further comprises reading the first page of data after a power loss has interrupted the subsequent programming pass. In an embodiment, the method further comprises reading the first page using a read voltage that is different from a read voltage that would have been used if the subsequent programming pass had completed.

In at least one embodiment, a system comprises a processor to send a write request to a storage device; and a storage device comprising a NAND flash memory and a storage device controller to store a first page of data identified by the write request in a plurality of cells of the NAND flash memory in a first programming pass; and preserve the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

In an embodiment, the first voltage and the second voltage are stepped up by an equal amount between program loops of the plurality of program loops. In an embodiment, the storage device controller is further to read the first page of data after a power loss has interrupted the subsequent programming pass. In an embodiment, the system further comprises one or more of: a battery communicatively coupled to the processor, a display communicatively coupled to the processor, or a network interface communicatively coupled to the processor.

In at least one embodiment, a system comprises means for storing a first page of data in a plurality of cells of a NAND flash memory in a first programming pass; and means for preserving the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

In an embodiment, the system further comprises means for stepping up the first voltage and the second voltage by an equal amount between program loops of the plurality of program loops. In an embodiment, the first voltage and the second voltage are applied to a wordline coupled to the plurality of cells. In an embodiment, the system further comprises means for reading the first page of data after a power loss has interrupted the subsequent programming pass. In an embodiment, the second group of cells comprises at least one cell that, after the first programming pass is completed and before the subsequent programming pass has started, has a threshold voltage that is lower than the threshold voltage of at least one cell of the first group of cells after the subsequent programming pass is completed.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a storage device comprising a NAND flash memory, the storage device to:
store a first page of data in a plurality of cells of the NAND flash memory in a first programming pass; and
preserve the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

2. The apparatus of claim 1, wherein the storage device is further to apply the first voltage to control gates of the first group of cells and apply the second voltage to control gates of the second group of cells.

3. The apparatus of claim 1, wherein the storage device is further to step up the first voltage and the second voltage by an equal amount between program loops of the plurality of program loops.

4. The apparatus of claim 1, wherein the storage device is further to apply the first voltage to the channels of the first group of cells and the second voltage to the channels of the second group of cells.

5. The apparatus of claim 1, wherein the second group of cells comprises at least one cell that, after the first programming pass is completed and before the subsequent programming pass has started, has a threshold voltage that is lower than the threshold voltage of at least one cell of the first group of cells after the subsequent programming pass is completed.

6. The apparatus of claim 1, wherein the storage device is further to preserve the readability of the first page of data in the plurality of cells during the subsequent programming pass by performing at least one program loop in which an effective program voltage is applied to cells of the second group, but an effective program voltage is not applied to cells of the first group.

7. The apparatus of claim 1, wherein the storage device is further to apply the second voltage to the second group of cells prior to application of the first voltage to the first group of cells during a program loop of the subsequent programming pass.

8. The apparatus of claim 1, wherein the storage device is further to apply the first voltage and the second voltage to a wordline coupled to the plurality of cells.

9. The apparatus of claim 1, wherein the storage device is further to:
store a second page of data in the plurality of cells of the NAND flash memory in the first programming pass; and
preserve the readability of the second page of data in the plurality of cells during the subsequent programming pass.

10. The apparatus of claim 1, wherein the storage device is further to program two additional pages of data in the plurality of cells during the subsequent programming pass.

11. The apparatus of claim 1, wherein the storage device is further to read the first page of data after a power loss has interrupted the subsequent programming pass.

12. The apparatus of claim 11, wherein the storage device is further to read the first page using a read voltage that is different from a read voltage that would have been used if the subsequent programming pass had completed.

13. A method comprising:
storing a first page of data in a plurality of cells of a NAND flash memory in a first programming pass; and
preserving the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

14. The method of claim 13, further comprising stepping up the first voltage and the second voltage by an equal amount between program loops of the plurality of program loops.

15. The method of claim 13, wherein the first voltage and the second voltage are applied to a wordline coupled to the plurality of cells.

16. The method of claim 13, further comprising reading the first page of data after a power loss has interrupted the subsequent programming pass.

17. A system comprising:
a processor to send a write request to a storage device; and
a storage device comprising:
a NAND flash memory; and
a storage device controller to:

store a first page of data identified by the write request in a plurality of cells of the NAND flash memory in a first programming pass; and preserve the readability of the first page of data in the plurality of cells during a subsequent programming pass comprising a plurality of program loops, at least one of the plurality of program loops to comprise application of a first voltage to a first group of cells of the plurality of cells and application of a second voltage to a second group of cells of the plurality of cells, wherein the first group comprises cells that were not programmed in the first programming pass and the second group comprises cells that were programmed in the first programming pass.

18. The system of claim 17, wherein the first voltage and the second voltage are stepped up by an equal amount between program loops of the plurality of program loops.

19. The system of claim 17, wherein the storage device controller is further to read the first page of data after a power loss has interrupted the subsequent programming pass.

20. The system of claim 17, further comprising one or more of: a battery communicatively coupled to the processor, a display communicatively coupled to the processor, or a network interface communicatively coupled to the processor.

* * * * *